United States Patent [19]

Ogawa et al.

[11] Patent Number: 4,649,313
[45] Date of Patent: Mar. 10, 1987

[54] PIEZOELECTRIC DISPLACEMENT ELEMENT

[75] Inventors: Toshio Ogawa, Kyoto; Satoru Fujishima, Muko; Akira Ando, Takatsuki, all of Japan

[73] Assignee: Murata Manufacturing Co., Ltd., Japan

[21] Appl. No.: 651,995

[22] Filed: Sep. 19, 1984

[30] Foreign Application Priority Data

Sep. 22, 1983 [JP] Japan ................ 58-175869

[51] Int. Cl.⁴ ............................................ H01L 41/08
[52] U.S. Cl. ................................... 310/358; 310/332; 310/359; 310/366; 310/328
[58] Field of Search ............................... 310/357–359, 310/332, 366, 363, 800, 328

[56] References Cited

U.S. PATENT DOCUMENTS

| Re. 27,116 | 4/1971 | Miller et al. | 310/359 |
| 1,798,101 | 3/1931 | Nicolson | 310/363 X |
| 3,163,783 | 12/1964 | Howatt et al. | 310/332 X |
| 3,489,931 | 1/1970 | Teaford | 310/359 X |
| 3,590,287 | 6/1971 | Berlincourt et al. | 310/359 X |
| 4,087,716 | 5/1978 | Heywang | 310/359 X |
| 4,330,730 | 5/1982 | Kurz et al. | 310/332 X |
| 4,443,729 | 4/1984 | Rider | 310/332 X |
| 4,564,782 | 1/1986 | Ogawa | 310/358 X |

Primary Examiner—Mark O. Budd
Attorney, Agent, or Firm—Ostrolenk, Faber, Gerb & Soffen

[57] ABSTRACT

Disclosed herein is a piezoelectric displacement element utilizing a sintered body obtained by stacking three or more ceramic layers (5a to 5h) through internal electrodes (6b to 6h) and co-firing the same. The sintered body has first, second and third regions when viewed in the direction of thickness. The first and third regions are so formed as to be displaced in reverse directions to each other. The second region consists of a plurality of piezoelectric ceramic layers (5d, 5e) in such a manner that an internal electrode (6e) interposed between the piezoelectric ceramic layers (5d, 5e) is connected with neither potentials in a driven state, whereby the second region is adapted not to be positively driven, to function as a buffer area.

9 Claims, 22 Drawing Figures

PIEZOELECTRIC DISPLACEMENT ELEMENT

BACKGROUND OF THE INVENTION

1. Field of the Invention

The present invention relates to a piezoelectric displacement element, and more particularly, it relates to structure of a piezoelectric displacement element utilizing a sintered body obtained by stacking a plurality of piezoelectric ceramic layers in the direction of thickness and co-firing the same.

2. Description of the Prior Art

As roughly illustrated in FIG. 1 showing a side view, Japanese patent Laying-Open Gazzete No. 69999/1981 discloses a piezoelectric displacement element employing a sintered body which is obtained by stacking a plurality of ceramic layers $2a$ to $2f$ through a plurality of internal electrodes $1b$ to $1f$ between electrodes $1a$ and $1g$ and co-firing the same. The electrodes $1a$ and $1g$ are formed similarly to the electrodes $1b$ to $1f$ or separately after firing. For performing a polarization process in the piezoelectric displacement element according to this prior art, electrical connection is effected as shown in FIG. 1 followed by application of voltages, whereby the respective ceramic layers $2a$ to $2f$ are polarized in the directions shown by arrows in FIG. 1. After such polarization is performed, the plus side and the minus side as shown in FIG. 1 are electrically connected so as to apply alternate currents from left and right external electrodes, whereby a first group of the ceramic layers $2a$ to $2c$ and a second group of the ceramic layers $2d$ to $2f$ are expanded and contracted in reverse directions to each other, so that the entire piezoelectric element causes bending movement. Thus, although such a multilayered type piezoelectric displacement element operates as a whole in a similar manner to a well-known bimorph vibrator, the thickness of the respective ceramic layers $2a$ to $2f$ can be considerably reduced since the sintered body utilized therein is obtained by stacking the ceramic layers $2a$ to $2f$ and co-firing the same. Therefore, the impedance can be lowered and the amount of displacement may readily be increased. However, since, in the piezoelectric displacement element having the aforementioned construction, the piezoelectric ceramic layers $2a$ to $2f$ are co-fired, the internal electrodes $1b$ to $1f$ are generally formed by coating metal paste or the like for forming the electrodes on the ceramic layers $2a$ to $2f$ and burning the same. Thus, the internal electrodes $1b$ to $1f$ are considerably thin in thickness, e.g., about 2 $\mu$m to 5 $\mu$m. Therefore, when the piezoelectric displacement element as shown in FIG. 1 is driven, ceramic crystal particles of the central ceramic layers $2c$ and $2d$ are expanded and contracted in reverse directions to each other, whereby the piezoelectric ceramic particles on both sides of the internal electrode $1d$ reciprocally constrain mutual expansion and contraction. In other words, since the first group of ceramic layers $2a$ to $2c$ provided above the internal electrode $1d$ and the second group of ceramic layers $2d$ to $2f$ provided below the same are displaced in opposite directions, the stress from the piezoelectric ceramic layers $2c$ and $2d$ provided on both sides of the internal electrode $1d$ concentrates in the vicinity of the internal electrode $1d$. Consequently, such stress concentration influences the displacement to cause considerably large displacement hysteresis in the piezoelectric displacement element as shown in FIG. 1. In other words, since the crystal particles forming the piezoelectric ceramic layers $2c$ and $2d$ through the internal electrode $1d$ are expanded and contracted in reverse directions with interposition of the internal electrode $1d$, large displacement hysteresis is caused when positive and negative voltages are alternately applied.

SUMMARY OF THE INVENTION

Accordingly, an essential object of the present invention is to overcome the aforementioned disadvantage of the prior art by providing a piezoelectric displacement element which can minimize displacement hysteresis while maintaining advantages of the multi-layered type piezoelectric displacement element.

According to a broad aspect of the present invention, there is provided a piezoelectric displacement element utilizing a sintered body comprising three or more ceramic layers and internal electrodes interposed between the ceramic layers, which sintered body is obtained by stacking the three or more ceramic layers through the internal electrodes and co-firing the same so that the sintered body has first, second and third regions when viewed in the direction of thickness. The first and third regions are adapted to be displaced in directions reverse to each other, while the second region has a buffer means for making displacement of the second region extremely small relative to that of the first and third regions to function as a buffering area for vibrations of the first and third regions in directions reverse to each other.

The aforementioned buffer means may comprise means for equalizing potentials of internal electrodes provided on both sides of the second region in the direction of thickness. Further, the buffer means may be implemented with forming the second region by a non-polarized ceramic layer, or by polarizing the ceramic layer in the second region less than the ceramic layers in the first and third regions. Thus, the polarization of the ceramic layer forming the second region is weaker than that of the ceramic layers forming the first and third regions, whereby stress concentration from the first and third regions driven in opposite directions to each other is effectively buffered by the second region.

Further, when the second region is formed of a plurality of ceramic layers, the aforementioned buffer means may further include a mesh-patterned internal electrode provided between the ceramic layers. Similarly, when the second region is formed of a plurality of ceramic layers, the buffer means may be implemented by making the each ceramic layer in the second region thicker than each ceramic layer in the first and third regions. Thus, the stress concentration from the first and third regions vibrating in reverse directions can also be buffered in the second region by making the ceramic layers forming the second region large in thickness.

The groups of the ceramic layers respectively forming the first and third regions need not necessarily be equal to each other in number of laminations, i.e., either the first region or the third region may be formed by ceramic layers larger in number than those of the other region, thereby to obtain a desired vibration mode of the piezoelectric displacement element.

The above and other objects, features, aspects and advantages of the present invention will become more apparent from the following detailed description of the present invention when taken in conjunction with the accompanying drawings.

BRIEF DESCRIPTION OF THE DRAWINGS

FIGS. 2 and 3 are side views showing the principle of the present invention, in which FIG. 2 shows a polarized state and FIG. 3 shows a driven state;

FIGS. 15 and 16 are illustrations showing a piezoelectric displacement element according to a fourth embodiment of the present invention, in which FIG. 15 shows electrical connection in a polarization process and FIG. 16 shows electrical connection in application of driving voltages;

FIGS. 17 and 18 are illustrations showing a piezoelectric displacement element according to a fifth embodiment of the present invention, in which FIG. 17 shows electrical connection in a polarization process and FIG. 18 shows electrical connection in application of driving voltages;

FIGS. 19 and 20 are illustrations showing a piezoelectric displacement element according to a sixth embodiment of the present invention, in which FIG. 19 shows electrical connection in a polarization process and FIG. 20 shows electrical connection in application of driving voltages; and FIGS. 21 and 22 are illustrations showing a piezoelectric displacement element according to a seventh embodiment of the present invention, in which FIG. 21 shows electrical connection in a polarization process and FIG. 22 shows electrical connection in application of driving voltages.

DESCRIPTION OF THE PREFERRED EMBODIMENTS

Figure 1:
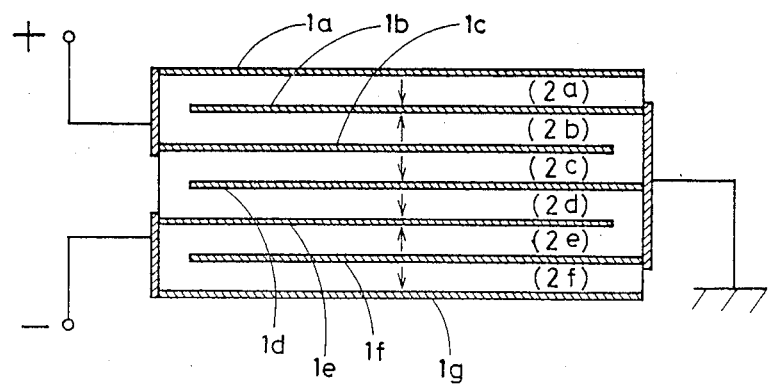
FIG. 1 is a side view showing a typical example of a conventional piezoelectric displacement element.
Figure 2:
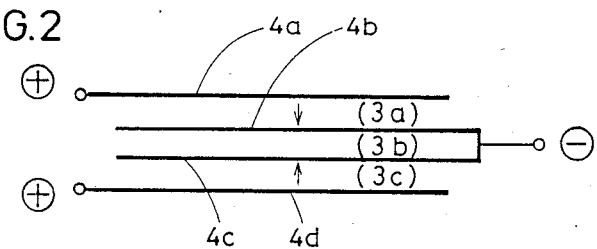
Figure 3:
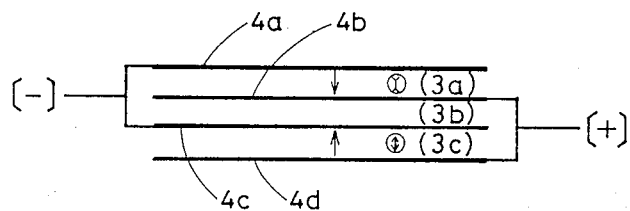

FIGS. 2 and 3 are illustrative of the principle of the present invention, respectively showing states of electrical connection in a polarization process and in application of driving voltages. Referring to FIG. 2, three ceramic layers 3a to 3c are stacked through internal electrodes 4b and 4c. One or more ceramic layers (not shown) may further be stacked through internal electrodes on outer sides in the vertical directions of electrodes 4a and 4d which are provided on the outer sides of the ceramic layers 3a and 3d, though, only three ceramic layers 3a to 3c are herein shown for case of understanding of the present invention. In the structure as shown in FIG. 2, the ceramic layer 3a forms a first region and the ceramic layer 3b forms a second region while the ceramic layer 3c forms a third region. When positive and negative voltages are applied as shown in FIG. 2, the ceramic layers 3a and 3c are polarized in reverse directions to each other as indicated by the arrows. On the other hand, the ceramic layer 3b is not polarized since potentials of the internal electrodes 4b and 4c are at the same value. Therefore, when electrical connection is subsequently made as shown in FIG. 3 to apply driving voltages, the ceramic layer 3a is contracted in the direction of thickness while the ceramic layer 3c is expanded in the direction of thickness. It is to be noted that marks as shown in the right-hand sides of the arrows showing the directions of polarization indicate expansion or contraction of the ceramic layers, with the mark ⊗ indicating the state contracted in the direction of thickness and the mark ⊕ indicating the state expanded in the direction of thickness.

Since, as obvious from FIG. 3, the ceramic layer 3b is not polarized, the ceramic layer 3b itself causes no vibration upon application of the driving voltages. Therefore, even if distortion caused by displacement in reverse directions to each other of the ceramic layers 3a and 3c respectively forming the first and third regions is added, such distortion is effectively buffered by the ceramic layer 3b forming the second region. Thus, it is possible to remarkably reduce displacement hysteresis due to the distortion caused by the displacement of the first and third regions, which are displaced in reverse directions to each other, by the second region.

Thus, according to the present invention, displacement hysteresis is reduced by providing a buffer means in the second region between the first and third regions which are displaced in reverse directions to each other, and such a buffer means may be implemented in various manners as hereinafter described with reference to the preferred embodiments of the present invention.

It may be considered that the structure as shown in FIG. 3 can formally be obtained by stacking previously polarized ceramic layers. In fact, similar structure may be obtained by preparing ceramic layers 3a and 3c previously polarized in the illustrated directions and stacking the same with a non-polarized ceramic layer 3b through internal electrodes. However, when such previously-polarized ceramic substances are utilized, add thickness of the ceramic layers cannot be reduced, wherefore the ceramic layers cannot be largely displaced. The present invention employs a sintered body obtained by stacking the ceramic layers through the internal electrodes in the aforementioned manner and co-firing the same. Therefore, it is to be noted that the present invention is absolutely different from a conventional piezoelectric displacement element which is structured by stacking a plurality of previously sintered ceramic layers.

FIGS. 4 to 10 are illustrative of the first embodiment of the present invention. According to the first embodiment, an even number of piezoelectric ceramic layers are stacked as a whole, and more specifically, eight piezoelectric ceramic layers are stacked. The term "number of stacking" as employed in this specification indicates the number of piezoelectric ceramic layers provided between the electrodes, and thus the number of the electrodes is larger by one than the "number of stacking".

Figure 4:
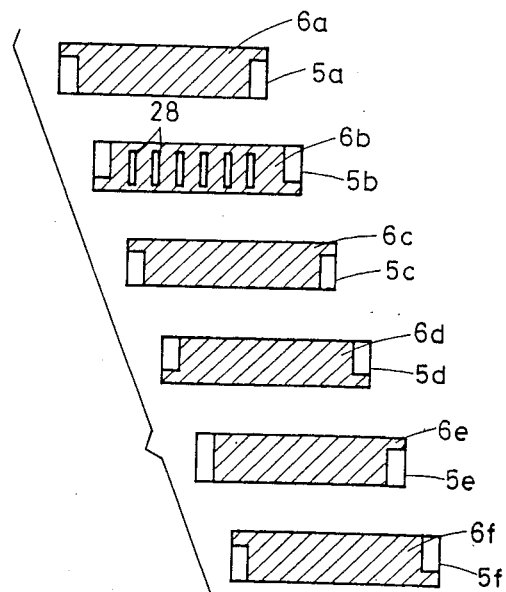
FIG. 4 is a plan view illustrative of ceramic layers and patterns of electrodes formed on the ceramic layers, which are employed in a first embodiment of the present invention.

First, as shown in FIG. 4, eight ceramic green sheets 5a to 5h are prepared for forming the piezoelectric ceramic layers (both the top and bottom views of sheet 5h are illustrated). The ceramic green sheets 5a to 5h may be made of ceramics such as lead titanate or barium titanate, ceramics such as lead zirconate titanate or modified ceramics of these ceramics. Metal paste coatings 6a to 6h for forming electrodes are coated by printing on predetermined areas of respective one surfaces of the ceramic green sheets 5a to 5h. With respect to the ceramic green sheet 5h, a metal paste coating 6i is coated by printing on a predetermined area of the other surface. In FIG. 4, the ceramic green sheet 5h is contoured by two-dot chain lines while the form of the metal paste coating 6i is shown as viewed from the aforementioned one surface side. The metal paste coatings 6a to 6i may be prepared by a metal or an alloy having a high melting point such as palladium or silver-palladium alloy. However, with respect to the metal paste coatings 6a and 6i, utilization of the metal or alloy such as palladium or silver-palladium with baking in the air leads to oxidization and increase in resistances. Therefore, baking may be performed after the sintered body is obtained, with utilization of, e.g., silver paste.

For obtaining predetermined thickness, each of the ceramic green sheets 5a to 5h may be formed by stacking a plurality of ceramic green sheet members.

When the ceramic green sheets 5a to 5h as shown in FIG. 4 are employed, bonding strength between the piezoelectric ceramic layers 5a to 5h may be slightly reduced after sintering due to interposition of the electrodes 6b to 6h. However, such a problem may easily be solved by various methods. For example, ceramic powder may be mixed into the metal paste for obtaining the electrodes 6b to 6h, so that the piezoelectric ceramic layers 5a to 5h are readily firmly bonded with each other by the ceramic powder after fired. Or, as illustrated with respect to the electrode 6b in FIG. 4, slits 28 may be provided partially in the areas for forming the electrodes so as to expose the piezoelectric ceramic layers at those portions. In this case, each adjacent piezoelectric ceramic layers are directly bonded with each other through the slits 28, whereby bonding strength after sintering is improved. As shown in FIG. 4, the slits 28 are preferably elongated perpendicularly to the longitudinal direction of each piezoelectric ceramic layer, not to obstruct bending vibration of the same.

The eight ceramic green sheets 5a to 5h as shown in FIG. 4, respectively coated with the metal paste, are stacked vertically in order. Then the ceramic green sheets 5a to 5h are closely adhered by pressure with each other and fired with the metal paste coatings 6a and 6i to obtain the sintered body. The metal paste coatings 6a and 6i may be baked to the sintered body after firing. In such a sintered body, the aforementioned ceramic green sheets 5a to 5h respectively form the piezoelectric ceramic layers while the metal paste coatings 6a to 6i form the electrodes. Thus, the formation patterns of the metal paste coatings 6a to 6i as shown in FIG. 4 directly correspond to the formation patterns of the electrodes. Therefore, the piezoelectric ceramic layers and the electrodes formed by specific ceramic green sheets and metal paste coatings are herein indicated by the same reference numerals as employed for the ceramic green sheets and the metal paste coatings for clarifying the correlation between the elements in the state before firing and those in the state after firing.

Figure 5:
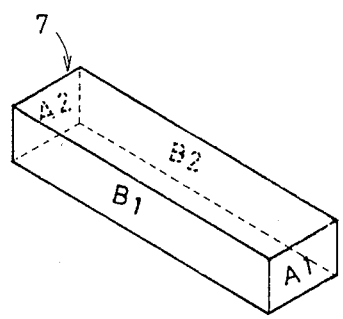
FIG. 5 is a perspective view for illustrating symbols specifying respective surfaces of a sintered body as employed in the present invention.

FIG. 5 illustrates the sintered body 7 obtained in the aforementioned manner, with symbols A1, A2, B1 and B2 indicating the four side surfaces thereof. These symbols are herein employed for specifying the surfaces to be provided with outer terminals, etc.

Figure 6:
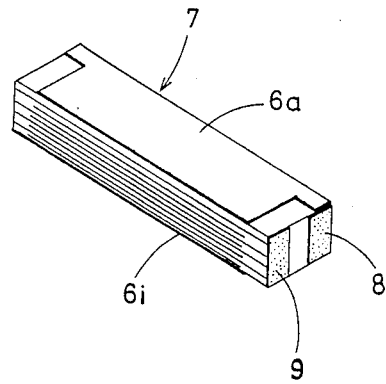
FIG. 6 is a perspective view showing a sintered body obtained by laminating the ceramic sheets as shown in FIG. 4 and firing the same, followed by provision of polarization electrodes.

The sintered body 7 is polarized as follows. For the polarization process, the side surface A1 as shown in FIG. 5 is provided with polarization electrodes 8 and 9 as shown in FIG. 6. The polarization electrodes 8 and 9 may be formed by baking silver since they are not subjected to a high temperature as employed in firing of the ceramic green sheets. As obvious from the forms of the electrode patterns shown in FIG. 4, the polarization electrode 8 is connected with the electrodes 6a, 6c, 6e, 6g and 6i while the other polarization electrode 9 is connected with the electrodes 6b, 6d, 6f and 6h. The state of such connection is shown in FIG. 7.

Figure 7:
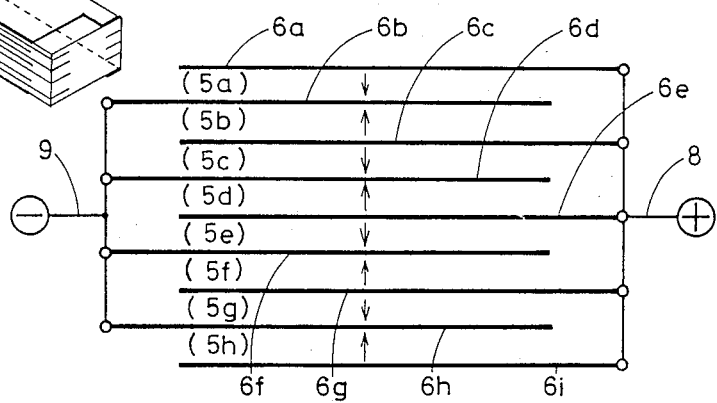
FIG. 7 is a side view showing electrical connection in polarization of the sintered body as shown in FIG. 6.

As shown in FIG. 7, one polarization electrode 8 is supplied with a plus potential and the other polarization electrode 9 is supplied with a minus potential for polarization process, whereby the piezoelectric ceramic layers 5a to 5h interposed between the electrodes 6a to 6i are polarized as shown by the arrows in the direction of thickness, i.e., in a head-to-head manner.

Figure 8:
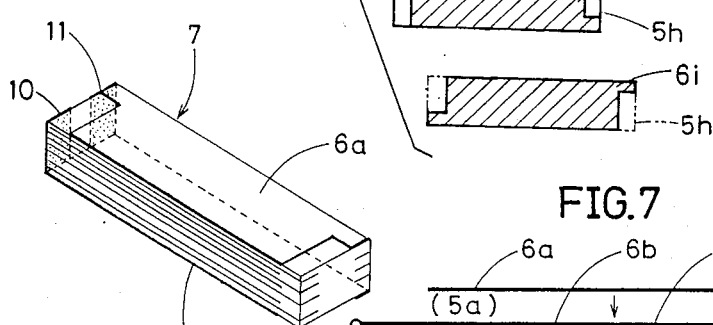
FIG. 8 is a perspective view showing the sintered body provided with outer terminals after the polarization process as shown in FIG. 7.
Figure 9:
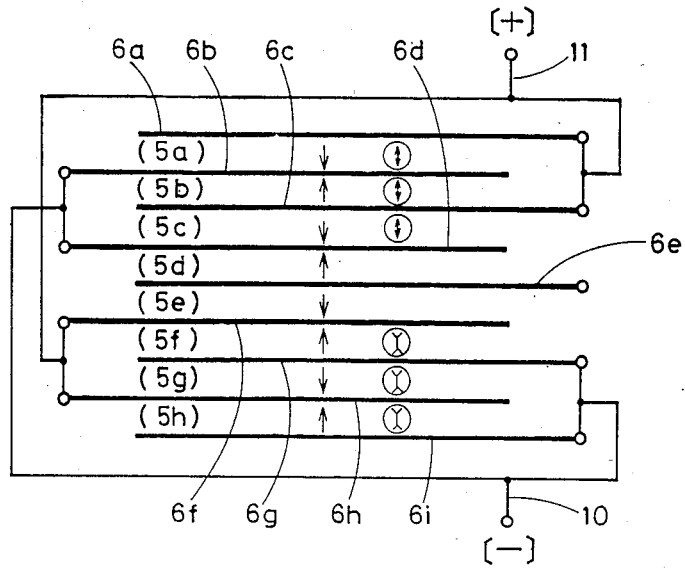
FIG. 9 is an illustration showing electrical connection in application of driving voltages to the sintered body as shown in FIG. 8 according to the first embodiment of the present invention.

After the polarization process has been completed, the polarization electrodes 8 and 9 are removed by any suitable method. Thereafter outer electrodes 10 and 11 are provided on the side surface A2 of the sintered body as shown in FIG. 5 as shown in FIG. 8. These outer electrodes 10 and 11 are made of so-called thermosetting conductive paste which is thermally hardened at a temperature causing no depolarization, e.g., within a temperature range up to 200° C. One outer electrode 10 is electrically connected with the electrodes 6b, 6d, 6g and 6i within those formed on the piezoelectric ceramic layers 5a to 5h in FIG. 4. The other outer electrode 11 is electrically connected with the electrodes 6a, 6c, 6f and 6h. As shown in FIG. 9, the electrical connection is obtained by formation of these outer electrodes 10 and 11.

When driving voltages are applied between the outer electrodes in FIG. 9, the sintered body 7 vibrates in a bending manner. In other words, for example, when the outer electrode 10 is supplied with a minus potential and the other outer electrode 11 is supplied with a plus potential, the piezoelectric ceramic layers 5a, 5b and 5c are expanded in the direction of thickness while the piezoelectric ceramic layers 5f, 5g and 5h are contracted in the direction of thickness. Thus, the piezoelectric ceramic layers 5a, 5b and 5c positioned in the upper side together define a first region which expands. The piezoelectric ceramic layers 5f, 5g and 5h positioned in the lower side, together define a third region which contracts. As a result, the groups of the piezoelectric ceramic layers respectively forming the first and third regions are displaced in directions reverse to each other. Therefore, when the outer electrodes 10 and 11 are supplied with the potentials shown in FIG. 9, the sintered body 7 as shown in FIG. 8 causes such bending that the central portion (layers 5d and 5e) in the longitudinal direction thereof projects downwardly. In contrast, when the outer electrodes 10 and 11 are supplied with the reverse potentials of that shown in FIG. 9, the sintered body 7 is bent in the reverse (upper) direction.

Obvious from FIG. 9, the fifth electrode 6e as positioned in the center of the sintered body 7 is not supplied with either a plus potential a minus potential and therefore is in an electrical open or floating state. Therefore, the piezoelectric ceramic layers 5d and 5e positioned on both sides of the electrode 6e are neither expanded nor contracted. Thus, the fifth electrode 6e is caused to be in the electrical open or idle state whereby the distortions caused by displacement of the piezoelectric ceramic layers 5a to 5c forming the first region and the piezoelectric ceramic layers 5f to 5h forming the third region are effectively absorbed by the piezoelectric ceramic layers 5d and 5e forming the second or central regions, so as to reduce displacement hysteresis caused by stress concentration due to the vibrations in the reverse directions transmitted from the first and third regions.

Figure 10:
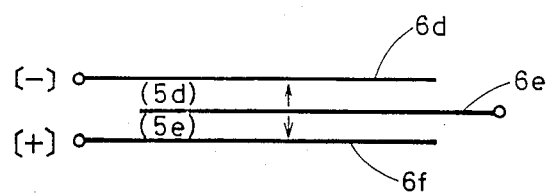
FIG. 10 is an illustration typically showing operation in a second region in the first embodiment of the present invention as shown in FIG. 8.

In fact, however, the piezoelectric ceramic layer 5d is slightly expanded in the direction of thickness while the piezoelectric ceramic layer 5e is slightly contracted in the direction of thickness as shown in FIG. 10, since disregarding the electrode 6e, the potential difference shown in FIG. 10 is caused between the electrodes 6d and 6f. However, since the voltages applied to the piezoelectric ceramic layers 5d and 5e are half of those applied to the other piezoelectric ceramic layers, the degree of expansion and contraction is reduced. Thus, the aforementioned displacement hysteresis is reliably reduced by setting the electrode 6e in an electrical open or floating state.

Figure 11:
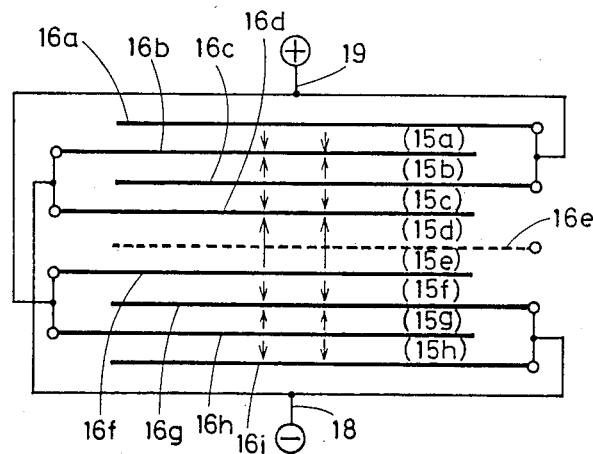
FIG. 11 is an illustration showing electrical connection in a polarization process in a second embodiment of the present invention, which is similar to FIG. 7 illustrative of the first embodiment.
Figure 12:
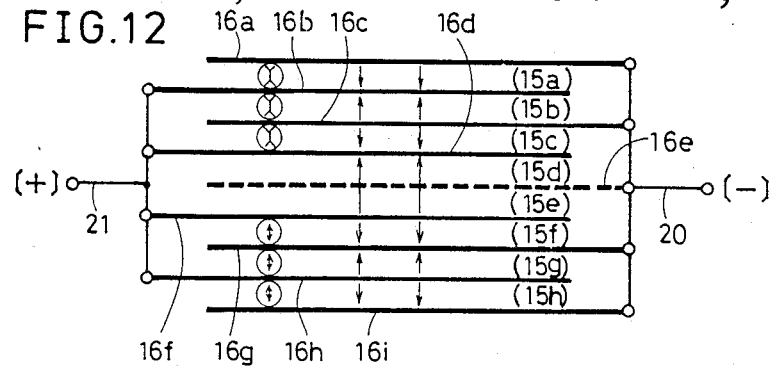
FIG. 12 is an illustration showing electrical connection in application of driving voltages in the second embodiment of the present invention.

FIGS. 11 and 12 show a second embodiment of the present invention, which are respectively similar to FIGS. 7 and 9 illustrative of the first embodiment. In the first embodiment shown in FIGS. 7 and 9, the polarization process is performed in the state of electrical connection as shown in FIG. 7 while the driving voltages are applied in the state of electrical connection as shown in FIG. 9. On the other hand, the polarization process is performed in the state of electrical connection as shown in FIG. 9 while the driving voltages are applied in the state of electrical connection as shown in FIG. 7 in the second embodiment. Such structure is hereafter described with reference to FIGS. 11 and 12.

As is clearly seen from FIG. 11 in comparison with FIG. 9, the outer electrodes 10 and 11 in FIG. 9 are replaced by polarization electrodes 18 and 19 in FIG. 11. Therefore, when, for example, the polarization electrode 18 is supplied with a minus potential and the polarization electrode 19 is supplied with a plus potential (as shown in FIG. 11), piezoelectric ceramic layers 15a to 15h are polarized in the directions indicated by the arrows. The electrode 16e is connected with neither of the potentials, and the piezoelectric ceramic layers 15d and 15e positioned on both sides thereof are polarized by potentials generated between the electrodes 16d and 16f.

However, since the distance between the electrodes 16d and 16f is twice as long as the thickness of each of the piezoelectric ceramic layers 15a, 15b, 15c, 15f, 15g and 15h, the degree of polarization is reduced as compared to the remaining layers.

Referring to FIG. 12, the polarization electrodes 8 and 9 as shown in FIG. 7 are replaced by outer electrodes 20 and 21 respectively. As shown in FIG. 12, assuming that, for example, the outer electrode 20 is supplied with a minus potential and the outer electrode 21 is supplied with a plus potential, the piezoelectric ceramic layers 15a to 15c and 15f to 15h are expanded and contracted as indicated by the marks showing double arrows.

Figure 13:
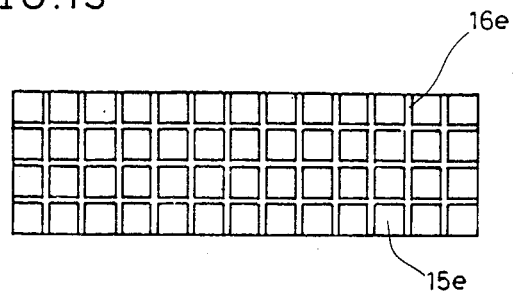
FIG. 13 is a plan view illustrating a modification of the pattern of an internal electrode provided in the second region.

Since the piezoelectric ceramic layers 15d and 15e, forming the second region as hereinabove described, are more weakly polarized weaker than the piezoelectric ceramic layers 15a to 15c and 15f to 15h respectively forming the first and third regions, the piezoelectric ceramic layers 15d and 15e vibrate more weakly than the other piezoelectric ceramic layers. Further, as shown in plan view in FIG. 13, the electrode 16e may be prepared by a mesh-formed electrode pattern provided on one side surface of the ceramic layer 15e. When the electrode 16e is thus provided in a mesh pattern, the piezoelectricity extractable between the electrode 16e and the electrode 16d or 16f in the driving state as shown in FIG. 12 is made remarkably small. Consequently, in addition to the low degree of polarization as hereinabove described, the piezoelectric ceramic layers 15d and 15e vibrate even weaker in comparison with the piezoelectric ceramic layers 15a to 15c and 15f to 15h forming the first and third regions respectively. Therefore, as shown in FIG. 12, the piezoelectric ceramic layers 15d and 15e are not marked by arrows. Thus, with vibrations extremely weaker than those of the other piezoelectric ceramic layers, the piezoelectric ceramic layers 15d and 15e can effectively absorb displacement hysteresis due to the distortions caused by the displacement of the upper and lower sides of the sintered body 7. In other words, in the embodiment as shown in FIG. 12, the buffer means according to the present invention is implemented by the relatively weak polarization of the piezoelectric ceramic layers 15d and 15e and/or the mesh-patterned formation of the internal electrode 16e.

Figure 14:
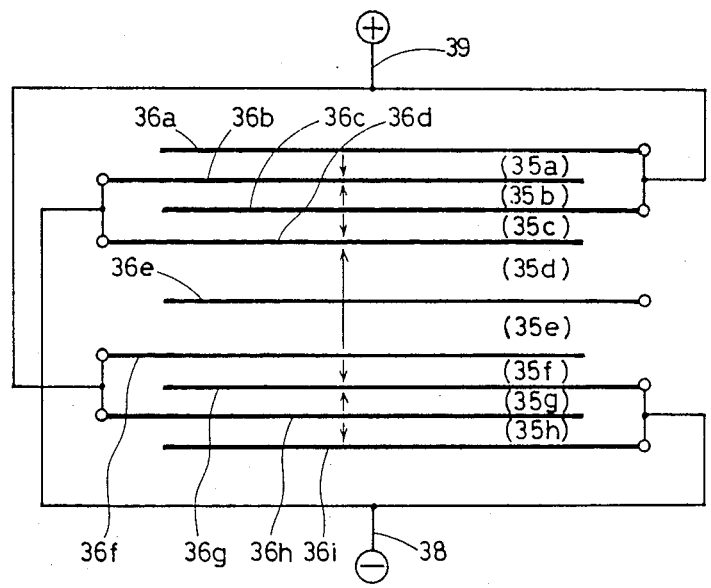
FIG. 14 is an illustration showing electrical connection in a polarization process in a third embodiment of the present invention.

FIG. 14 illustrates a third embodiment of the present invention, which shows the state of electrical connection in a polarization process. The feature of the third embodiment resides in that piezoelectric ceramic layers 35d and 35e forming a second region are formed considerably larger in thickness than respective piezoelectric ceramic layers 35a to 35c forming a first region and respective piezoelectric ceramic layers 35f to 35h forming a third region. Since the structure of other portions is similar to that shown in FIGS. 11 and 12, explanation is omitted with respect to other components which are indicated by corresponding reference numerals. The thickness of the piezoelectric ceramic layers 35d and 35e is selected, for example, to be about 70 μm when that of the other piezoelectric ceramic layers is 40 μm. It is understood that the degree of polarization of the piezoelectric ceramic layers 35d and 35e is made weaker than that of the other piezoelectric ceramic layers by making the piezoelectric ceramic layers 35d and 35e thicker. Thus, according to this embodiment, displacement hysteresis can be decreased based on the distortion caused by expansion and contraction of the piezoelectric ceramic layers 35d and 35e further effectively in comparison with the above embodiment as shown in FIGS. 11 and 12.

Figure 15:
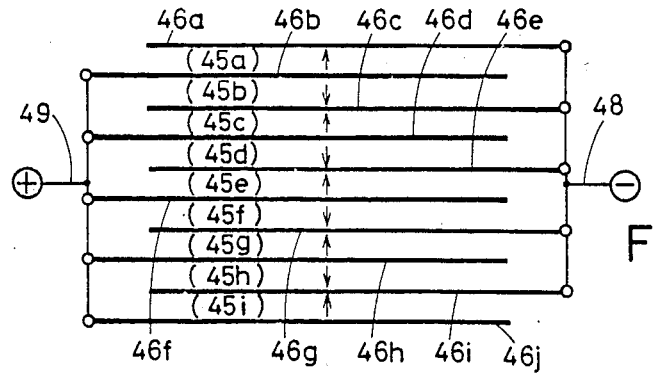
Figure 16:
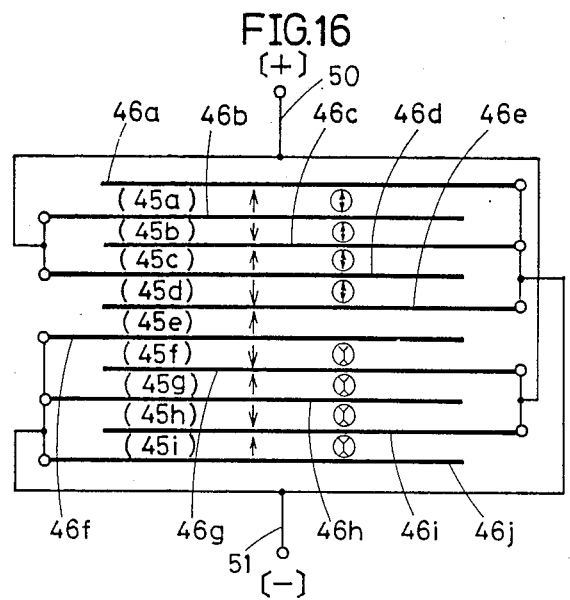

FIGS. 15 and 16 illustrate a fourth embodiment of the present invention, respectively showing the state of electrical connection in a polarization process and that in a driving state. An odd number of, i.e., nine piezoelectric ceramic layers are stacked in the shown example. In this embodiment, nine piezoelectric ceramic layers 45a to 45i are stacked through internal electrodes 46b to 46i with provision of electrodes 46a and 46j, and are fired together to obtain a sintered body which is similar to those in the aforementioned embodiments, in which electrical connection is performed as shown in FIG. 15 for polarization processing. In this embodiment, all of the piezoelectric ceramic layers 45a to 45i are polarized in reverse directions to each other in a head-to-head manner as shown in FIG. 15. Then, electrical connection is performed as shown in FIG. 16 for application of driving voltages, and when, for example, an outer electrode 50 is supplied with a plus potential and another outer electrode 51 is supplied with a minus terminal, the piezoelectric ceramic layers 45a to 45d are expanded in the direction of thickness and the piezoelectric ceramic layers 45f to 45i are contracted in the direction of thickness. Thus, the groups of the piezoelectric ceramic layers 45a to 45d and 45f to 45i respectively forming first and third regions are expanded and contracted in reverse directions to each other.

In the embodiment as shown in FIG. 16, the internal electrodes 46e and 46f provided on opposite sides of the piezoelectric ceramic layer 45e as shown are connected to be at the same potential value. Therefore, although polarized in the direction indicated by the arrow in FIG. 16, the piezoelectric ceramic layer 45e is subjected to no voltage differential, and consequently it causes no vibration. Thus, according to the embodiment as shown in FIG. 16, the buffer means is formed by the internal electrodes 46e and 46f provided on both sides of the piezoelectric ceramic layer 45e forming a second region, so that no vibration is caused in the second region. Accordingly, the stress concentration due to displacements caused in the first and third regions in directions reverse to each other is effectively absorbed in the piezoelectric ceramic layer 45e forming the second region also in this embodiment.

Figure 17:
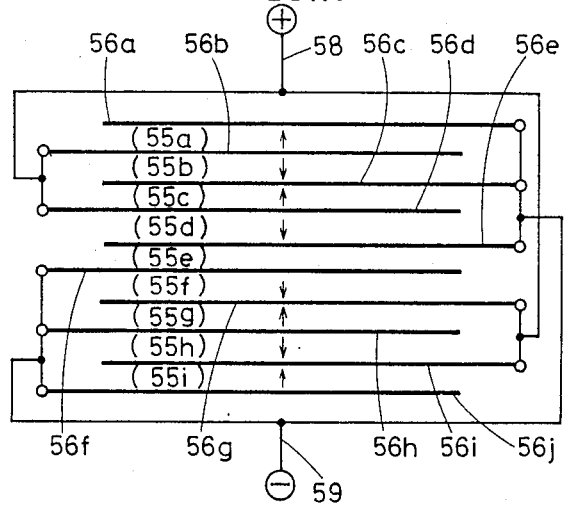
Figure 18:
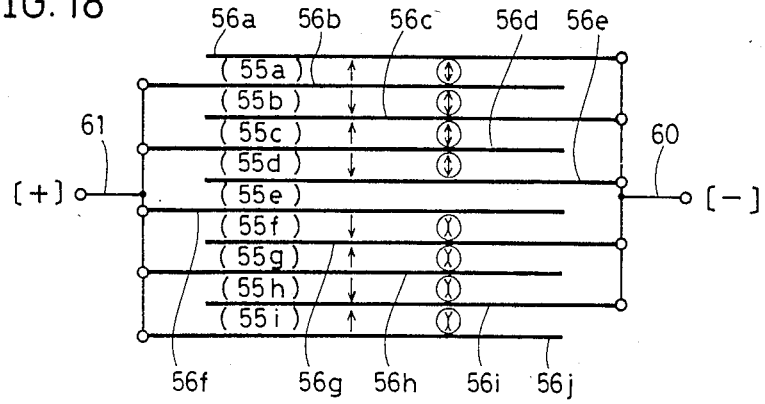

FIGS. 17 and 18 illustrate a fifth embodiment of the present invention, in which FIG. 17 shows the state of electrical connection in a polarization process and FIG. 18 shows that in application of driving voltages. The embodiment as shown in FIGS. 17 and 18 is an inverted modification of the embodiment as shown in FIGS. 15 and 16. Namely, in the embodiment as shown in FIGS. 17 and 18, the sintered body identical to that in the previous embodiment is subjected to polarization processing in the state of electrical connection as shown in FIG. 16 and supplied with driving voltages in the state as shown in FIG. 15. Therefore, in the polarization process as shown in FIG. 17, a piezoelectric ceramic layer 55e forming a second region will not vibrate upon application of the driving voltages as shown, since the region is not polarized. Thus, according to the fifth embodiment of the present invention as shown in FIGS. 17 and 18, the piezoelectric ceramic layer 55e, which forms the second region similarly to that in the embodiment as shown in FIGS. 15 and 16, functions as the buffer means since the same itself is not polarized, thereby to enable provision of a piezoelectric displacement element in which displacement hysteresis is minimized.

In all of the embodiments as hereinabove described, the groups of the piezoelectric ceramic layers respectively forming the first and third regions are made equal in number to each other. In other words, the first and third regions vibrating in reverse directions to each other are made equal in thickness in all of the aforementioned embodiments to be capable of vibrating equally in reverse directions to each other with respect to the direction of thickness. However, the present invention is not restricted to such structure. In the following two further embodiments, the first and third regions are different in thickness from each other.

Figure 19:
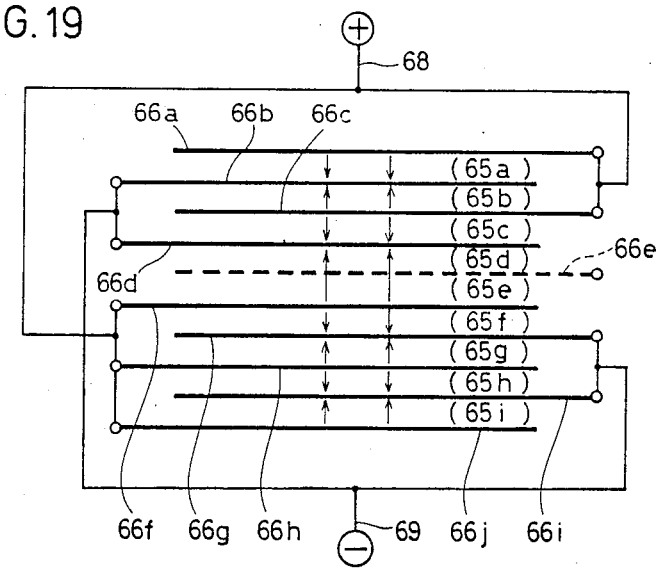
Figure 20:
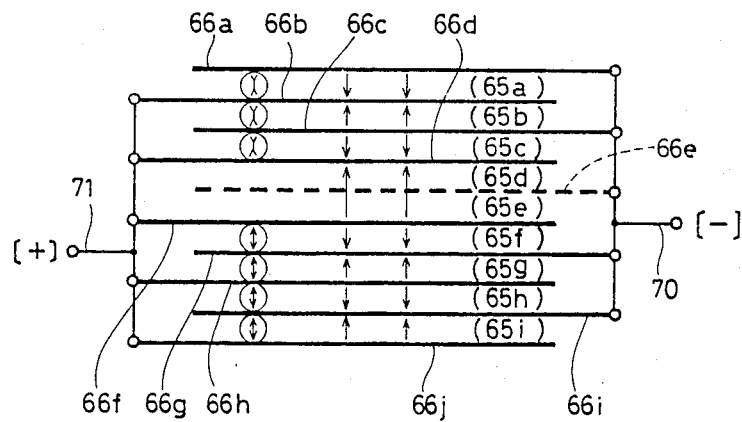

FIGS. 19 and 20 illustrate a sixth embodiment of the present invention, in which FIG. 19 shows the state of electrical connection in a polarization process and FIG. 20 shows the state of electrical connection in application of driving voltages. The sixth embodiment as shown in FIGS. 19 and 20 is similar to that shown in FIGS. 11 and 12, with the addition of one more piezoelectric ceramic layer. As readily understood in reference to FIGS. 11 and 12, one more piezoelectric ceramic layer is provided in the lower end of the stacked piezoelectric ceramic layers in the embodiment as shown in FIGS. 19 and 20. Therefore, with the provision of an additional piezoelectric ceramic layer 65i according to the embodiment as shown in FIGS. 19 and 20, four piezoelectric ceramic layers 65f to 65i vibrate in a third region while three piezoelectric ceramic layers 65a to 65c vibrate in a first region as is clearly seen from FIG. 20. Although symmetrical bending vibrations are not obtained in the embodiment as shown in FIGS. 19 and 20, a piezoelectric displacement element having such a vibration mode is also included in the present invention.

Figure 21:
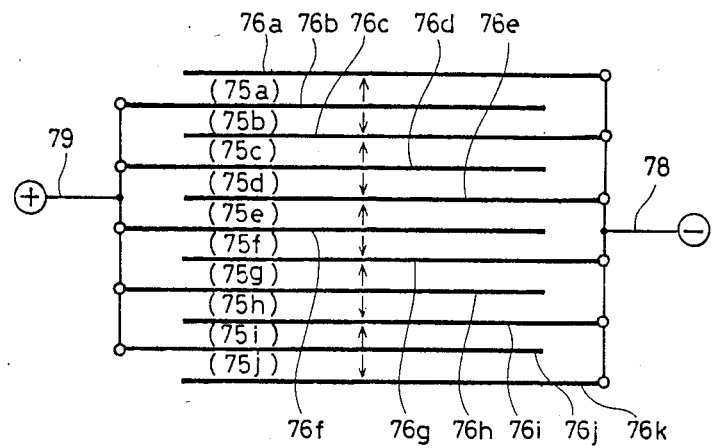
Figure 22:
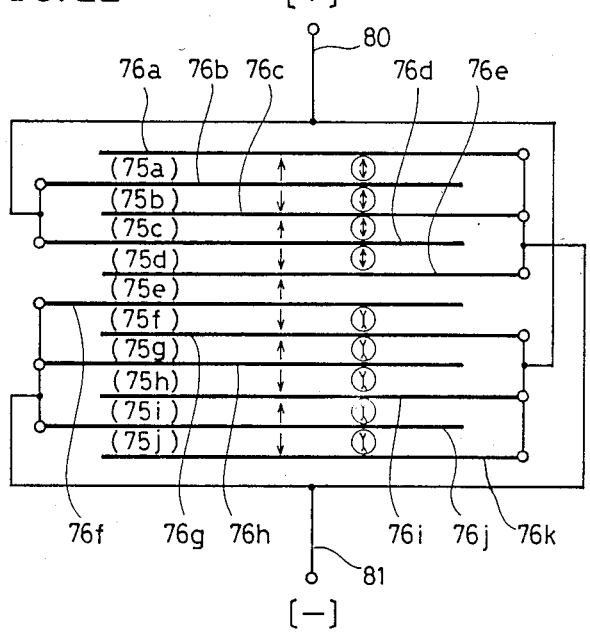

FIGS. 21 and 22 illustrate a seventh embodiment of the present invention, respectively showing the state of electrical connection in a polarization process and that in application of driving voltages. This embodiment as shown in FIGS. 21 and 22 also presents asymmetrical bending vibrations similarly to the embodiment as shown in FIGS. 19 and 20. According to the seventh embodiment, as readily understood by comparison with FIGS. 17 and 18, one more piezoelectric ceramic layer is added in the lower side of the piezoelectric ceramic layer 55i provided in the embodiment as shown in FIGS. 17 and 18. Since the structure of the seventh embodiment is substantially identical with that shown in FIGS. 17 and 18, explanation is omitted with respect to components which are indicated by corresponding reference numerals. With provision of an additional piezoelectric ceramic layer 75j according to the seventh embodiment, five piezoelectric ceramic layers 75f to 75j vibrate in a third region while four piezoelectric ceramic layers vibrate in a first region as seen from FIG. 22. Thus, asymmetrical bending vibrations are obtained similarly to the embodiment as shown in FIGS. 19 and 20.

Since, in either of the embodiments as shown in FIGS. 19 and 20 and in FIGS. 21 and 22, the second region defined between the first and third regions has a buffer means similarly to the aforementioned embodiments as shown in FIGS. 11 and 12 and in FIGS. 15 and 16, it is, needless to say, possible to minimize displacement hysteresis due to distortions caused by the displacement of the first and third regions in reverse directions to each other.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A monolithic piezoelectric displacement element comprising:

a sintered body including ceramic material comprised in at least three ceramic layers and internal electrodes interposed between said ceramic layers, said sintered body being formed by stacking said at least three ceramic layers with a respective group of at least one said internal electrode being located between each adjacent pair of ceramic layers and then simultaneously firing the ceramic layers and electrodes together, said ceramic layers being coextensive with one another and having coextensive longitudinal edges, said internal electrodes extending to and alongside the major portion of said longitudinal edges:

said sintered body having first, second and third regions when viewed in a thickness direction of said displacement element;

said ceramic material in said first and third regions being conditioned to be displaced in reverse directions to each other when appropriate electrical potentials are applied to internal electrodes of said first and third regions; and buffer means, comprising said ceramic material in said second region which is located between said first and third regions and which is characterized in that displacement of said second region is significantly smaller than displacement of said first and third regions, said buffer means being instrumental for alleviating a stress concentration in said second region in a manner that reduces a displacement hysteresis associated with said piezolectric displacement element.

2. A piezoelectric displacement element in accordance with claim 1, wherein said buffer means comprises means for equalizing the potential of electrodes provided on opposite sides of said second region as measured in the thickness direction of said sintered body.

3. A piezoelectric displacement element in accordance with claim 1, wherein said buffer means comprises a region of weaker polarization than that of respective ceramic layers in said first and third regions.

4. A piezoelectric displacement element in accordance with claim 3, wherein said second region includes first and second ceramic layers, and said buffer means further includes a mesh-patterned internal electrode interposed between said first and second ceramic layers, said mesh-patterned internal electrode being one of said internal electrodes.

5. A piezoelectric displacement element in accordance with claim 3, wherein said second region includes a plurality of ceramic layers, and said buffer means is implemented by forming each said ceramic layer of said second region larger in thickness than each of said ceramic layers forming said first and third regions.

6. A piezoelectric displacement element in accordance with claim 1, wherein said second region is nonpolarized and said first and third regions are polarized.

7. A piezoelectric displacement element in accordance with claim 1, wherein said second region includes first and second ceramic layers, and said buffer means comprises a said internal electrode which is interposed between said first and second ceramic layers of said second region and which is in an electrical open state.

8. A piezolectric displacement element in accordance with claim 1, wherein the number of said ceramic layers making up said first region is different than the number of said ceramic layers making up said second region.

9. A piezoelectric displacement element in accordance with claim 1, wherein said first and second regions are adjacent one another and said second and third regions are adjacent one another.

* * * * *